United States Patent [19]

Iizuka et al.

[11] Patent Number: 4,584,470
[45] Date of Patent: Apr. 22, 1986

[54] SINGLE-POLARIZATION FIBER OPTICS MAGNETIC SENSOR

[75] Inventors: Hisao Iizuka; Hiroshi Kajioka, both of Hitachi, Japan

[73] Assignee: Hitachi Cable Limited, Tokyo, Japan

[21] Appl. No.: 558,941

[22] Filed: Dec. 7, 1983

[51] Int. Cl.$^4$ ............................................. G01B 11/00
[52] U.S. Cl. .................. 250/231 R; 324/96; 356/365; 350/96.30
[58] Field of Search ............ 250/227, 231 R; 350/96.29, 96.30, 96.31; 324/96; 356/365

[56] References Cited

U.S. PATENT DOCUMENTS

| | | | |
|---|---|---|---|
| 4,298,245 | 11/1981 | Aulich et al. | 350/96.29 |
| 4,415,230 | 11/1983 | Keck | 350/96.30 |
| 4,426,129 | 1/1984 | Matsumura et al. | |
| 4,442,350 | 4/1984 | Rashleigh | 250/227 |
| 4,468,090 | 8/1984 | Ulrich et al. | 350/96.30 |

OTHER PUBLICATIONS

Rashleigh, "Magnetic-Field Sensing with a Single-Mode Fiber", Optics Letters, Jan. 1981, vol. 6, No. 1, pp. 19-21.

Primary Examiner—Edward P. Westin
Attorney, Agent, or Firm—Frishauf, Holtz, Goodman & Woodward

[57] ABSTRACT

In a single-polarization fiber optics magnetic sensor comprising a light source, a Faraday rotation element, a photodetector, and optical waveguide means for optically coupling them; according to a first embodiment, the optical waveguide means comprises upstream and downstream polarization-maintaining optical fibers coupled to the entrance and exit of the Faraday rotation element without a polarizer or an analyzer interposed therebetween; according to a second embodiment, in addition thereto, the axis of polarization of the downstream polarization-maintaining optical fiber is at an angle of about 45 degrees with respect to the orientation of the linearly polarized light exiting from the Faraday rotation element at a magnetic field intensity H equal to 0; and according to a third embodiment, in addition thereto, a polarization beam splitter is located in alignment with the orientation of polarization of the exit light from the downstream polarization-maintaining optical fiber, and two polarized light beams produced by said beam splitter are received by two photo-detectors for subsequent signal computation.

9 Claims, 4 Drawing Figures

SINGLE-POLARIZATION FIBER OPTICS MAGNETIC SENSOR

BACKGROUND OF THE INVENTION

1. Field of the Invention

This invention relates to single-polarization fiber optics magnetic sensors.

2. Description of the Prior Art

A typical prior art single-polarization fiber optics magnetic sensor is described with reference to FIG. 1. A light source 1 emits light which is focused through a focusing lens 2 into one end of an optical fiber 3 which transmits the light to the other end. The light exiting from the optical fiber is converted into parallel rays through a collimator 4, which are passed through a polarizer 5 which produces linearly polarized light. This linearly polarized light enters a Faraday rotation element 6 and is derived out as signal light through an analyzer 7 optically coupled to the exit of the element 6. The signal light is received by a photo-detector 8 which is electrically connected to an instrument 10 through a lead 9. The orientation of the polarizer 5 and the analyzer 7 is set to 45° or 90°.

In this arrangement, the positioning of the polarizer 5 and the analyzer 7 at the opposite ends of the Faraday rotation element 6 is indispensable. In the case of usual single- or multi-mode fibers, if the polarizer 5 is inserted between the light source 1 and the optical fiber 3, then the incident light to the Faraday rotation element 6 will generally become elliptically polarized light rather than linearly polarized light. It is obvious that the analyzer 7 is indispensable.

However, the temperature at which the polarizer 5 and the analyzer 7 can be used is normally limited to about 70° C. because they are reduced in performance at higher temperatures. On the other hand, as magnetic sensors are often used in high temperature atmospheres, for example, in substation transformers, they are required to operate at high temperatures of the order of 110° C.

OBJECT OF THE INVENTION

It is, therefore, an object of the present invention to provide a magnetic sensor capable of operating at relatively high temperatures.

SUMMARY OF THE INVENTION

According to a first embodiment of the present invention, there is provided a single-polarization fiber optics magnetic sensor comprising a light source, a Faraday rotation element, a photo-detector, and optical waveguide means for optically coupling them, wherein the optical waveguide means comprises polarization-maintaining optical fibers located on the opposite sides of the Faraday rotation element without a polarizer or an analyzer interposed therebetween.

According to a second embodiment of the present invention, there is provided a single-polarization fiber optics magnetic sensor comprising a light source, a Faraday rotation element, a photo-detector, and optical waveguide means for optically coupling them, wherein the optical waveguide means comprises upstream and downstream polarization-maintaining optical fibers coupled to the entrance and exit of the Faraday rotation element without a polarizer or an analyzer interposed therebetween, and the axis of polarization of the downstream polarization-maintaining optical fiber is at an angle of about 45 degrees with respect to the orientation of the linearly polarized light exiting from the Faraday rotation element at a magnetic field intensity H equal to 0.

According to a third embodiment of the present invention, there is provided a single-polarization fiber optics magnetic sensor comprising a light source, a Faraday rotation element, a photo-detector, and optical waveguide means for optically coupling them, wherein the optical waveguide means comprises upstream and downstream polarization-maintaining optical fibers coupled to the entrance and exit of the Faraday rotation element without a polarizer or an analyzer interposed therebetween, the axis of polarization of the downstream polarization-maintaining optical fiber is at an angle of about 45 degrees with respect to the orientation of the linearly polarized light exiting from the Faraday rotation element at a magnetic field intensity H equal to 0, a polarization beam splitter is located in alignment with the orientation of polarization of the exit light from the downstream polarization-maintaining optical fiber, and two polarized light beams produced by said beam splitter are received by two photo-detectors for subsequent signal computation.

In any of these embodiments, preferably, the light source alone or combined with a polarizer is coupled to the upstream polarization-maintaining optical fiber such that linearly polarized light may enter the fiber in the same direction as the axis of polarization of the fiber whereby the linearly polarized light is transmitted to the Faraday rotation element.

The polarization-maintaining optical fibers used herein may be one described in Japanese Patent Application Kokai No. SHO 57-37305 (corresponds to U.S. Pat. No. 4,426,129), but not limited thereto.

DESCRIPTION OF THE PREFERRED EMBODIMENTS

Figure 1:
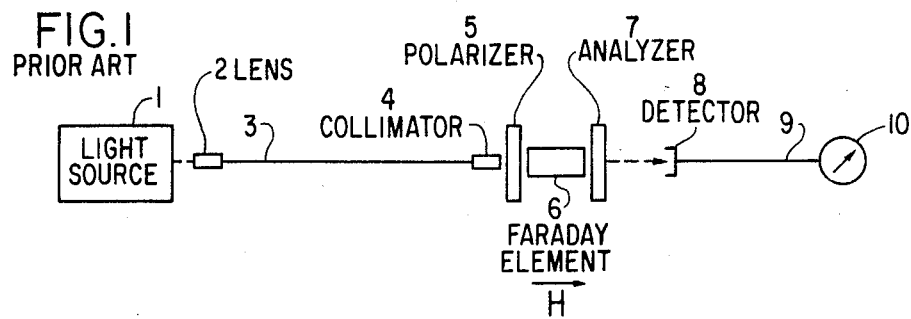
FIG. 1 is a schematic illustration of a prior art magnetic sensor.
Figure 2:
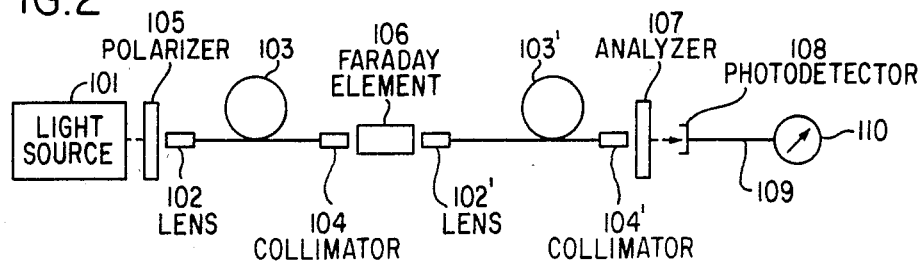
FIGS. 2 and 3 are schematic illustrations of different embodiments of the magnetic sensor according to the present invention.

The first and second embodiments of the magnetic sensor according to the present invention will be described with reference to FIG. 2.

A light source 1, for example, a laser emits light to an upstream polarization-maintaining optical fiber 103 through a polarizer 105 for ensuring improved polarization linearity. Desirably, the orientation of the polarizer 105 is aligned with the axis of polarization of the upstream polarization-maintaining optical fiber 103 at a precision within 2 degrees. With the precision of 2 degrees, the ratio of the incident light entering the polarization-maintaining optical fiber 103 along a given axis of polarization to the incident light along another axis of polarization is 29 dB.

The exit light from the upstream polarization-maintaining optical fiber 103 enters a Faraday rotation element 106 in the form of a YIG device in the illustrated embodiment. A downstream polarization-maintaining optical fiber 103' is coupled to the exit of the Faraday rotation element 106 such that the axis of polarization of the downstream polarization-maintaining optical fiber 103′ is at an angle of about 45 degrees with respect to the plane of polarization of the exit light from the Faraday rotation element 106 at a magnetic field intensity H=0. Also, this alignment is desirably accomplished at a precision within 2 degrees.

The exit light from the downstream polarization-maintaining optical fiber 103′ enters a photo-detector 108 through an analyzer 107. The orientation of the analyzer 107 is aligned with the axis of polarization of the downstream polarization-maintaining optical fiber 103′. Also this alignment is desirably made at a precision within 2 degrees.

The upstream and downstream optical fibers 103 and 103′ are provided with focusing lens 102 and 102′ at their entrance, respectively. The photo-detector 108 is connected to an instrument 110 through a lead 109.

When precision is within 2 degrees in all the three alignments, namely, between polarizer 105 and upstream fiber 103, Faraday rotation element 106 and downstream fiber 103′, and downstream fiber 103′ and analyzer 107, measurement error will be 0.4%.

The third embodiment of the magnetic sensor according to the present invention will be described with reference to FIG. 3. The construction of the third embodiment is partially identical with that of the first embodiment, and the identical portion will be understood without further description.

Figure 3:
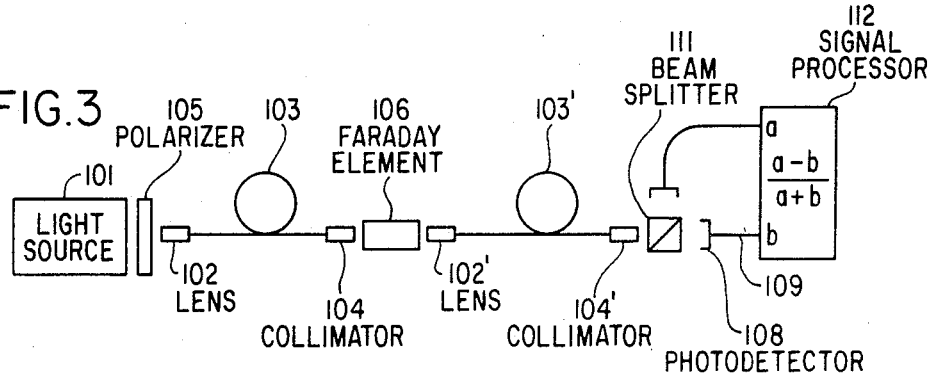

In the embodiment of FIG. 3, the eixt light from the downstream polarization-maintaining optical fiber 103′ enters a polarization beam splitter 111. It is desirable that the optical axis of the polarization beam splitter 111 is aligned with the axis of polarization of the exit beam from the downstream polarization-maintaining optical fiber 103′ at a precision within 2 degrees.

The polarization beam splitter 111 splits the incoming light into reflected and transmitted light beams which are respectively received by two photo-detectors 108 and supplied as electric signals to a signal processor 112 through leads 109.

The signals are computed by the signal processor 112 to give a signal which does not depend upon variations in the output of the light source and is free of a direct current component at a magnetic field intensity H=0.

More specifically, one output of the polarization beam splitter 111 is represented by $$a = A\,(1 + \sin KH),$$

the other output of the beam splitter is represented by $$b = A\,(1 - \sin KH),$$

and then the signal obtained through computation is:

$$f = (a-b)/(a+b) = \sin KH$$

where A and K are constants.

When precision is within 2 degrees in all the three alignments, measurement error will be 0.4%.

Figure 4:
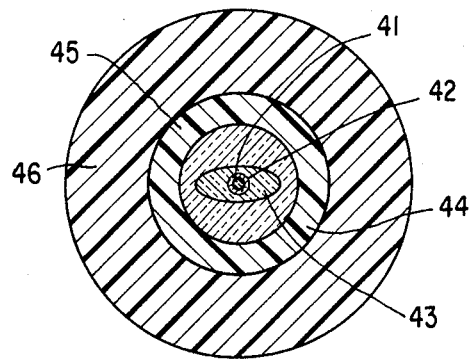
FIG. 4 is a cross section showing one example of a polarization-maintaining optical fiber used in the magnetic sensor according to the present invention.

One preferred example of the polarization-maintaining optical fibers 103 and 103′ used herein is shown in the cross section of FIG. 4. The optical fiber comprises a core 41, a clad 42, an elliptic jacket 43, and a support 44, with all the elements having glass-based compositions. A resin layer 45 is applied and baked onto the surface of the optical glass fiber, and is further covered with a protective layer 46 of thermoplastic resin.

The magnetic sensor of the present invention as described above has accomplished the following outstanding effects. (1) Since neither a polarizer nor an analyzer is used in proximity to the Faraday rotation element, measurement can be made even at temperatures as high as about 110° C. or more. (2) Since the Faraday rotation element lies between polarization-maintaining optical fibers such that the axes of polarization of the fibers are displaced about 45 degrees with respect to each other, more precise measurement can be made. (3) A signal which does not depend upon variations in the output of the light source and is free of a direct current component is obtained by the use of a polarization beam splitter which separates the exit light from the downstream polarization-maintaining optical fiber into two polarized light beams for computation.

The three preferred embodiments of the present invention are discussed above by way of example although the present invention is not limited to them, and modifications and changes may be made without departing from the spirit and scope of the invention.

What we claim is:

1. In a single-polarization fiber optics magnetic sensor comprising:
   a light source; a Faraday rotation element; a photo-detector; and optical waveguide means for optically coupling together said light source, Faraday rotation element and photo-detector;
   the improvement wherein:
   said optical waveguide means comprises polarization-maintaining optical fibers coupled to opposite sides of said Faraday rotation element without a polarizer and without an an analyzer interposed between said Faraday rotation element and said respective polarization-maintaining optical fibers, said optical fibers serving only as an optical waveguide for transmitting optical signals.

2. In a single-polarization fiber optics magnetic sensor comprising:
   a light source; a Faraday rotation element having an entrance and an exit; a photo-detector; and optical waveguide means for optically coupling together said light source, Faraday rotation element and photo-detector;
   the improvement wherein:
   said optical waveguide means comprises upstream and downstream polarization-maintaining optical fibers respectively coupled to said entrance and exit of said Faraday rotation element without a polarizer and without an analyzer interposed said Faraday rotation element and said respective polarization-maintaining optical fibers, said optical fibers serving only as an optical waveguide for transmitting optical signals; and
   said downstream polarization-maintaining optical fiber has an axis of polarization which is at an angle of substantially 45 degrees with respect to the orientation of linearly polarized light exiting from said Faraday rotation element at a magnetic field intensity H equal to 0.

3. The single-polarization fiber optics magnetic sensor of claim 2, wherein said light source is coupled to said upstream polarization-maintaining optical fiber such that linearly polarized light may enter said upstream polarization-maintaining fiber in the same directions as the axis of polarization of said upstream polarization-maintaining fiber, whereby said linearly polarized light is transmitted to said Faraday rotation element via said upstream polarization-maintaining optical fiber.

4. The single-polarization fiber optics magnetic sensor of claim 2, further comprising a polarizer coupled between said light source and said upstream polarization-maintaining optical fiber, whereby linearly polarized light may enter said upstream polarization-maintaining fiber in the same direction as the axis of polarization of said upstream polarization-maintaining fiber, said linearly polarized light being transmitted to said Faraday rotation element via said upstream polarization-maintaining optical fiber.

5. The single-polarization fiber optics magnetic sensor of claim 2, wherein said angle of said axis of polarization of said downstream polarization-maintaining optical fiber with respect to the orientation of said linearly polarized light is in a range of 45 degrees ±2 degrees.

6. In a single-polarization fiber optics magnetic sensor comprising:
a light source; a Faraday rotation element having an entrance and an exit; a photo-detector; and optical waveguide means for optically coupling together said light source, Faraday rotation element and photo-detector; the improvement wherein:
said optical waveguide means comprises upstream and downstream polarization-maintaining optical fibers respectively coupled to said entrance and exit of said Faraday rotation element without a polarizer and without an analyzer interposed between said Faraday rotation element and said respective polarization-maintaining optical fibers, said optical fibers serving only as an optical waveguide for transmitting optical signals;
said downstream polarization-maintaining optical fiber has an axis of polarization which is at an angle of substantially 45 degrees with respect to the orientation of linearly polarized light exiting from said Faraday rotation element at a magnetic field intensity H equals to 0;
a polarization beam splitter is provided and is arranged in alignment with the orientation of polarization of light exiting from said downstream polarization-maintaining optical fiber, said polarization beam splitter producing two polarized light beams; and
two photo-detectors are coupled to respectively detect said two polarized light beams and to deliver resultant detection signals to a computation means.

7. The single-polarization fiber optics magnetic sensor of claim 6, wherein said light source and a polarizer are coupled to said upstream polarization-maintaining optical fiber such that linearly polarized light may enter said upstream polarization-maintaining fiber in the same direction as the axis of polarization of said upstream polarization-maintaining fiber, whereby said linearly polarized light is transmitted to said Faraday rotation element via said upstream polarization-maintaining optical fiber.

8. The single-polarization fiber optics magnetic sensor of claim 6, further comprising a computation means coupled to said two photo-detectors for performing a predetermined computation on the output signals from said two photo-detectors to generate a signal which is independent of variations in the output of said light source and which is free of a direct current component at a magnetic field intensity H equals to 0.

9. The single-polarization fiber optics magnetic sensor of claim 6, wherein said angle of said axis of polarization of said downstream polarization-maintaining optical fiber with respect to the orientation of said linearly polarized light is in a range of 45 degrees ±2 degrees.

* * * * *